United States Patent
Tsai et al.

(10) Patent No.: US 7,055,532 B2
(45) Date of Patent: Jun. 6, 2006

(54) METHOD TO REMOVE FLUORINE RESIDUE FROM BOND PADS

(75) Inventors: How-Cheng Tsai, Kaohsiung (TW); Hung-Hsin Liu, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 182 days.

(21) Appl. No.: 10/741,321

(22) Filed: Dec. 18, 2003

(65) Prior Publication Data

US 2005/0136662 A1    Jun. 23, 2005

(51) Int. Cl.
*B08B 6/00* (2006.01)
*C25F 1/00* (2006.01)
*C25F 3/30* (2006.01)
*C25F 5/00* (2006.01)

(52) U.S. Cl. .................. 134/1.1; 134/1.2; 134/1.3; 438/710; 438/714; 438/720; 438/722

(58) Field of Classification Search ........... 134/1.1–1.3
See application file for complete search history.

(56) References Cited

U.S. PATENT DOCUMENTS

| | | | | |
|---|---|---|---|---|
| 5,202,291 A | * | 4/1993 | Charvat et al. | 438/696 |
| 5,380,401 A | * | 1/1995 | Jones et al. | 438/712 |
| 5,514,247 A | * | 5/1996 | Shan et al. | 438/700 |
| 5,888,906 A | | 3/1999 | Sandhu et al. | |
| 6,006,764 A | * | 12/1999 | Chu et al. | 134/1.2 |
| 6,162,733 A | | 12/2000 | Obeng | |
| 6,221,752 B1 | * | 4/2001 | Chou et al. | 438/612 |
| 6,368,518 B1 | | 4/2002 | Vaartstra | |
| 6,566,269 B1 | * | 5/2003 | Biles et al. | 438/706 |
| 6,692,903 B1 | * | 2/2004 | Chen et al. | 430/329 |

* cited by examiner

*Primary Examiner*—Duy-Vu N. Deo

(74) *Attorney, Agent, or Firm*—Duane Morris LLP

(57) ABSTRACT

The process of the present invention comprises reactive ion etching of $Al_xF_yO_z$ oxide deposits on aluminum-containing bond pads using feed gases, such as, $SF_6/CF_4/Ar$ or $Cl_2/BCL_3/Ar$, whose active plasma etches the $Al_xF_yO_z$ oxide deposits by physical etching and chemical etching for more complete removal of the $Al_xF_yO_z$ oxide deposits.

18 Claims, 1 Drawing Sheet

METHOD TO REMOVE FLUORINE RESIDUE FROM BOND PADS

FIELD OF THE INVENTION

The present invention relates to a method of fabricating a semiconductor device, and more particularly, to a method of removing residual fluorine oxide compound, $Al_xF_yO_z$, from aluminum-containing bond pad surfaces.

BACKGROUND OF THE INVENTION

After the terminal metal bond pads are defined and etched on a semiconductor wafer, a passivation layer, generally $SiO_2$ and SiN, is deposited on the wafer to protect the bond pads from the subsequent manufacturing process steps. In some products, a cost-effective polyimide, one kind of photoresist coated on plasma enhanced SiN (also referred to as PESN, which is a SiN film deposited using plasma enhanced chemical vapor deposition (CVD) process), is used to define the pattern of passivation layer and remains as residue on the wafer surface after passivation removal etching step. The residue left behind by the cost-effective polyimide is fluorine rich and the fluorine reacts with aluminum of the bond pads, producing $Al_xF_yO_z$. Fluorine acts as an oxidizing agent and produces undesirable oxide deposits, $Al_xF_yO_z$, on the bond pads. The $AlFO_3$ deposits on the bond pads are not desirable because they result in non-optimal wire bonds and cause the affected wafers to fail quality control wire-bondability testing. This type of defects are non-reworkable and the wafers are scrapped.

Another source of the troublesome $AlFO_3$ oxide desposits are associated with the etching of the silicon nitride protective passivation layer from the wafer during a pad mask patterning step at the end of the wafer processing. The silicon nitride passivation layer is etched with a dry/plasma etch performed in fluorine containing gases, such as $CHF_3$, $CF_4$, $C_2F_6$, $C_2F_2$, $C_4F_8$, etc. After a wafer has undergone the pad mask patterning step, residual fluorine may remain on the bond pads from the fluorine containing etch chemicals used in the dry/plasma etch process. This fluorine residue on the aluminum-containing bond pads produces undesirable oxide deposits, $Al_xF_yO_z$.

One known solution to this problem is removing the $Al_xF_yO_z$ oxide deposits by argon plasma etching in the presence of a plasma enhancing carrier gas, such as carbon dioxide, or an inert gas, such as, helium, xenon, neon, krypton, etc. However, this argon plasma etching is a physical etching method and does not always satisfactorily remove the $Al_xF_yO_z$ oxide deposits.

SUMMARY OF THE INVENTION

A method is disclosed herein for effectively removing the $Al_xF_yO_z$ oxide deposits from aluminum-containing bond pads during a semiconductor wafer processing utilizing an improved active plasma etching that combines physical etching and chemical etching. The active plasma feed gas can be $SF_6/CF_4/Ar$ or $Cl_2/BCL_3/Ar$ or other gas that can form a plasma capable of etching $Al_xF_yO_z$ oxide deposits. Plasma etching utilizing these feed gas is more effective in removing the $Al_xF_yO_z$ oxide deposits because the $SF_6/CF_4$ and $Cl_2/BCL_3$ components of the plasma provide chemical etching that complements the physical etching of argon plasma. Another advantage of the active plasma etching is that the resulting Al bond pad surfaces are smoother when compared to those surfaces cleaned with the conventional inert gas plasma etching, such as argon plasma etch.

BRIEF DESCRIPTION OF THE DRAWINGS

The invention will be better understood from the following detailed description of an exemplary embodiment thereof in conjunction with the accompanying drawings in which.

Features shown in the above referenced drawings are not intended to be drawn to scale, nor are they intended to be shown in precise positional relationship.

DETAILED DESCRIPTION OF THE INVENTION

Figure 1:
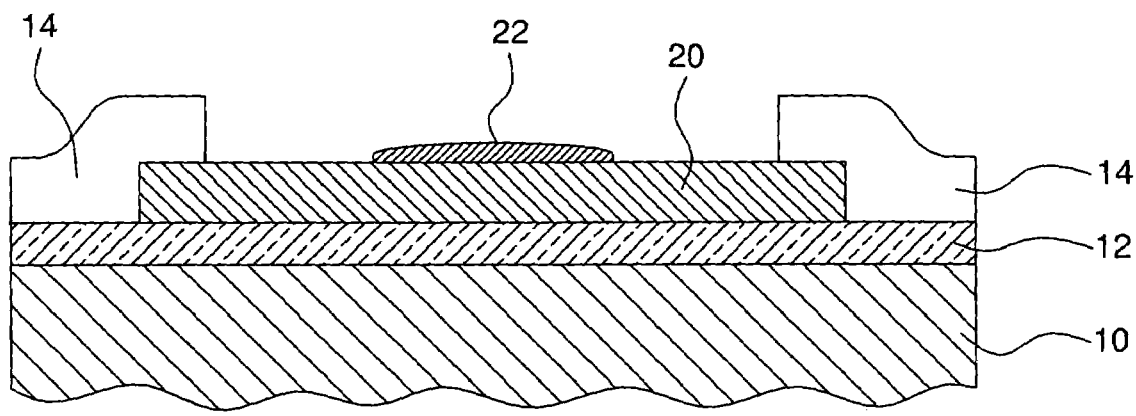
FIG. 1 is a schematic cross-section of a bond pad on which is disposed an undesired $Al_xF_yO_z$ oxide deposit.

FIG. 1 is a schematic cross-section illustrating a typical aluminum-containing bond pad on a semiconductor wafer contaminated with an undesirable $Al_xF_yO_z$ oxide deposit. An aluminum-containing bond pad 20 is comprised, for example, of aluminum or aluminum alloy and disposed on a substrate 10 on which has been grown an oxide layer 12 of a semiconductor device. Bond pad 20 is covered by a passivation layer 14, typically silicon nitride, into which an opening has been etched to expose bond pad 20. On the surface of bond pad 20 is an undesirable contaminant $Al_xF_yO_z$ oxide deposit 22. $Al_xF_yO_z$ oxide deposit 22 is typically formed by the residual fluorine left behind by the silicon nitride etching process which is typically a dry/plasma etch performed in fluorine containing gases, such as $CHF_3$, $CF_4$, $C_2F_6$, $C_2F_2$, $C_4F_8$, etc.

Figure 2:
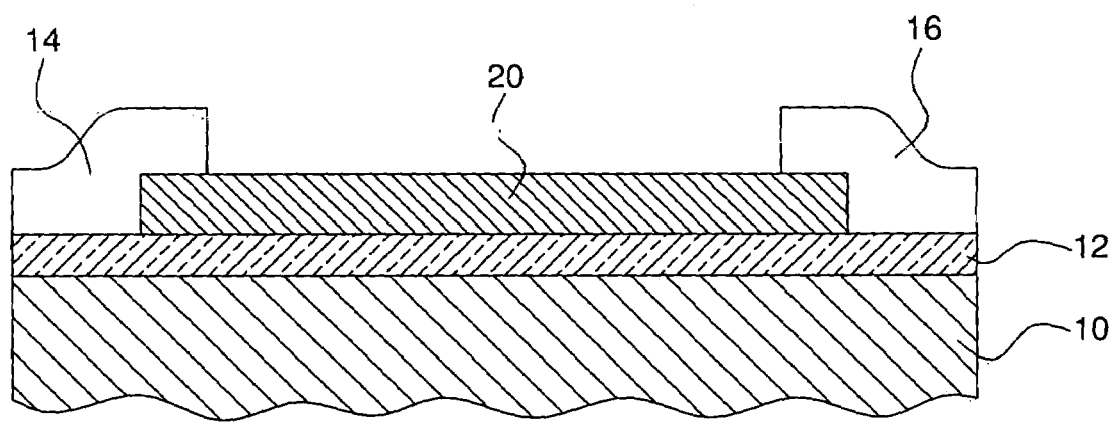
FIG. 2 is a schematic cross-section of the bond pad or FIG. 1, after the undesired $Al_xF_yO_z$ oxide deposit has been removed, according to the process of the present invention.

FIG. 2 illustrates bond pad 20 of FIG. 1, after the undesirable contaminant $Al_xF_yO_z$ oxide deposit 22 has been removed by the process of the present invention leaving a substantially clean bond pad 20.

According to the present invention, the $Al_xF_yO_z$ oxide deposit removal etch step is preferably performed just after the dry/plasma etching of the silicon nitride passivation layer 14. This additional etch is preferably performed in situ, i.e., in the same etch chamber as the silicon nitride passivation layer etch. The in situ process is both convenient and cost effective because it utilizes the existing manufacturing equipment and thus minimize the added manufacture process time associated with removal of $Al_xF_yO_z$ oxide deposit 22.

According to one embodiment of the present invention $Al_xF_yO_z$ oxide deposit 22 is removed by reactive ion etch using $SF_6/CF_4/Ar$ feed gas. This feed gas formulation provides a combination of physical and chemical etching of $Al_xF_yO_z$ oxide deposit 22. The inert gas component, Argon, of the plasma is the physical etching gas and provides the physical etching. The halogen containing gas, $SF_6/CF_4$, of the plasma is the chemical etching gas and provides the chemical etching.

The reactive ion etch step is preferably conducted at about 200 mT chamber pressure and about 700 W power. The feed gas, $SF_6/CF_4/Ar$, may be provided into the chamber as a mixture in the desired ratio by using a pumping speed of 5–15 cc per minute at standard condition (SCCM) for $SF_6$, 10–30 sccm for $CF_4$, and 70–200 SCCM for Ar. The etch duration should be sufficiently long to ensure removal of the $Al_xF_yO_z$ oxide deposits from the aluminum-containing bond pad. For the recipe of the feed gas provided herein, the time duration should be at least 60 seconds. Preferably the etch duration should be about 120 seconds with the feed gas mixture of 10 SCCM/20 SCCM/135 SCCM for $SF_6/CF_4/Ar$, respectively. In another embodiment of the present invention, $Cl_2/BCL_3$ may be used as the chemical etching gas component of the plasma feed gas along with the argon gas.

Regardless of the particular plasma gas used for the reactive ion etch step described above, some F or Cl residue is likely to be left on the bond pads and the polyimide passivation covered surface of the wafer. In an embodiment of the present invention where $SF_6/CF_4/Ar$ is used for the reactive ion etch step, a cleaning process that partially removes the polyimide passivation layer from the wafer surface may be sufficient to remove any fluorine-based residue. A low energy $O_2$ plasma may be used to partially etch the surface of the polyimide passivation layer and remove any surface contamination. In an embodiment of the present invention where $Cl_2/BCL_3/Ar$ is used for the reactive ion etch step, additional cleaning steps may be necessary to remove Cl-based elements because $Cl_2$ attacks aluminum. $CF_4$ plasma may be utilized to induce exchanging of Cl with less reactive F. Then, a low energy $O_2$ plasma may be used to partially etch the surface of the polyimide passivation layer and remove any surface contamination including the F that just displaced the Cl. If the low energy $O_2$ plasma etching is not sufficient to remove all residue from the plasma gas, a high energy $O_2$ plasma may be used to strip off the polyimide passivation layer and apply a new polyimide passivation layer.

While the foregoing invention has been described with reference to the above embodiments, various modifications and changes can be made without departing from the spirit of the invention. For example, reactive ion etch utilizing other mixture of feed gases to accomplish a combination of physical and chemical etching of $Al_xF_yO_z$ oxide deposit by the active plasma are considered to be within the scope of the invention defined by the appended claims.

What is claimed is:

1. A process for removing AlxFyOz oxide deposits from an aluminum-containing bond pad on a semiconductor wafer comprising the steps of:
   exposing the aluminum-containing bond pad to a reactive ion etch feed gas, which is a mixture of $SF_6/CF_4/Ar$ in a reactive ion etcher;
   applying energy to the reactive ion etch feed gas mixture, thereby forming an active plasma inside reactive ion etcher, wherein the active plasma removes the fluorine contaminants from the aluminum-containing bond pad by physical etching and chemical etching; and
   a cleaning step comprising a low energy $O_2$ plasma etching for partially removing polyimide passivation layer from the wafer to remove any fluorine-based residue.

2. A process of claim 1, wherein the $SF_6/CF_4/Ar$ feed gas is provided into the reactive ion etcher in a ratio of about 5–15 sccm, 10–30 sccm, and 70–200 sccm, respectively.

3. A process of claim 1, wherein the $SF_6/CF_4/Ar$ feed gas is provided into the reactive ion etcher in a ratio of about 10 sccm, 20 sccm, and 135 sccm, respectively.

4. The process of claim 1, wherein the reactive ion etcher is maintained at 200 mTorr and the energy applied is about 700 Watts for at least 60 seconds.

5. The process of claim 1, wherein the reactive ion etcher is maintained at 200 mTorr and the energy applied is about 700 Watts for about 120 seconds.

6. A process of claim 1, wherein the $SF_6/CF_4/Ar$ feed gas is provided into the reactive ion etcher in a ratio of about 5–15 sccm, 10–30 sccm, and 70–200 sccm, respectively.

7. A process of claim 1, wherein the $SF_6/CF_4/Ar$ feed gas is provided into the reactive ion etcher in a ratio of about 10 sccm, 20 sccm, and 135 sccm, respectively.

8. A process for removing AlxFyOz oxide deposits from an aluminum-containing bond pad on a semiconductor wafer comprising the steps of:
   exposing aluminum-containing bond pad to a reactive ion etch feed gas, which is a mixture of $Cl_2/BCL_3/Ar$ in a reactive ion etcher;
   applying energy to the reactive ion etch feed gas mixture, thereby forming an active plasma inside the reactive ion etcher, wherein the active plasma removes the fluorine contaminants from the aluminum-containing bond pad by physical etching and chemical etching; and
   a cleaning step comprising a high energy $O_2$ plasma etching for completely removing polyimide passivation layer from the wafer to remove any chlorine-based residue.

9. The process of claim 8, wherein the reactive ion etcher is maintained at 200 mTorr and the energy applied is about 700 Watts for at least 60 seconds.

10. The process of claim 8, wherein the reactive ion etcher is maintained at 200 mTorr and the energy applied is about 700 Watts for about 120 seconds.

11. A process for removing AlxFyOz oxide deposits from an aluminum-containing bond pad of a semiconductor wafer comprising the steps of:
    disposing the aluminum-containing bond pad in a reactive ion etch chamber,
    providing an atmosphere in the chamber comprising argon gas and at least one other gas comprising $SF_6/CF_4$, wherein the at least one other gas is capable of chemically etching AlxFyOz oxide deposits when the gas in in a plasma state;
    creating a plasma in the chamber, wherein the plasma reacts with the AlxFyOz oxide deposits, removing the AlxFyOz oxide deposits from the aluminum-containing bond pad by both physical etching and chemical etching; and
    a cleaning step comprising a low energy $O_2$ plasma etching for partially removing polyimide passivation layer from the wafer to remove any fluorine-based residue.

12. The process of claim 11, wherein the reactive ion etcher is maintained at 200 mTorr and the energy applied is about 700 Watts for at least 60 seconds.

13. The process of claim 11, wherein the reactive ion etcher is maintained at 200 mTorr and the energy applied is about 700 Watts for at least 120 seconds.

14. A process of claim 11, wherein the $SF_6/CF_4$ feed gas is provided into the reactive ion etcher in a ratio of about 5–15 sccm, 10–30 sccm, and 70–200 sccm, respectively.

15. A process of claim 11, wherein the $SF_6/CF_4$ feed gas is provided into the reactive ion etcher in a ratio of about 10 sccm, 20 sccm, and 135 sccm, respectively.

16. A process for removing AlxFyOz oxide deposits from an aluminum-containing bond pad of a semiconductor wafer comprising the steps of:
    disposing the aluminum-containing bond pad in a reactive ion etch chamber,
    providing an atmosphere in the chamber comprising argon gas and at least one other gas comprising $Cl_2/$ BCL$_3$, wherein the at least one other gas is capable of chemically etching AlxFyOz oxide deposits when the gas is in a plasma state;

creating a plasma in the chamber, wherein the plasma reacts with the AlxFyOz oxide deposits, removing the AlxFyOz oxide deposits from the aluminum-containing bond pad by both physical etching and chemical etching; and a cleaning step comprising a high energy O$_2$ plasma etching for completely removing polyimide passivation layer from the wafer to remove any chlorine-based residue.

17. The process of claim 16, wherein the reactive ion etcher is maintained at 200 mTorr and the energy applied is about 700 Watts for at least 60 seconds.

18. The process of claim 16, wherein the reactive ion etcher is maintained at 200 mTorr and the energy applied is about 700 Watts for at least 120 seconds.

* * * * *